July 24, 1962 R. EMEIS 3,046,405

TRANSISTOR DEVICE

Filed Jan. 19, 1959

United States Patent Office 3,046,405
Patented July 24, 1962

3,046,405

TRANSISTOR DEVICE

Reimer Emeis, Pretzfeld, Upper Franconia, Germany, assignor to Siemens-Schuckertwerke Aktiengesellschaft, Berlin-Siemensstadt, and Erlangen, Germany, a corporation of Germany Filed Jan. 19, 1959, Ser. No. 787,732
Claims priority, application Germany Jan. 22, 1958
4 Claims. (Cl. 250—211)

My invention relates to transistors, phototransistors, and related electric semiconductor devices of the junction type. Such devices comprise a usually monocrystalline semiconductor body of extrinsic conductance which is fusion-joined with metallic electrode components, the semiconductor substance consisting in most cases of germanium, silicon, or of such substances as indium antimonide, indium arsenide, gallium phosphide or other semiconductor compounds of the type known as $A_{III}$ $B_V$ and formed in equal atomic proportions of respective elements from the third and fifth B-groups of the periodic system of elements.

It is an object of my invention to provide a transistor device which affords a much greater sensitivity or amplification than heretofore attainable with transistor units of comparable size.

Another object is to devise a transistor device affording plural-stage or multi-stage amplification within a single structural unit applicable as a circuit component for a great variety of purposes.

Still another object of the invention is to devise a photoelectric sensing device or phototransistor of extreme sensitivity.

According to my invention, I provide a plurality of individually operable transistors with a single semiconductor body and with common collector means such as single collector electrode, the semiconductor body being preferably a flat plate or disc of rectangular or circular shape. Each of the transistors has its own base electrode and emitter electrode, and the respective base regions of the transistors are constituted by partial regions of a single coherent stratum of the semiconductor body having in that stratum a given uniform type of conductance, namely p-type or n-type, differing from the conductance type of the semiconductor region adjacent to the collector electrode. The individual emitter electrodes of all transistors are disposed beside the respective base electrodes in alternating sequence and are joined with junction-forming semiconductor areas embedded in, or surrounded by, the contiguous base region common to the combined transistors.

The base electrodes and the emitter electrodes of the transistors are preferably mounted on one of the two flat sides of the plate or disc of semiconductor material, whereas the common collector electrode is located on the opposite side of the semiconductor body.

According to another feature of my invention, the base and emitter electrodes of the respective individual transistors are connected with the corresponding electrodes of the other transistors by a cascade network so that the entire transistor combination forms a plural-stage amplifier. In encapsuled transistor designs the connecting leads between the base and emitter electrodes of the transistors are preferably accommodated within the housing or capsule so that the entire device forms a single rigid structure. For example, when encapsuling the device by embedding it in a body of casting resin, the semiconductor body and all electrodes, as well as the appertaining terminal leads and cascade connections, are preferably fully embedded in the casting resin so that only the input and output leads emerge therefrom.

By virtue of the cascade connection, a transistor unit according to the invention constitutes an amplifying component of multiplied amplification factor. For example, with three combined transistors, representing a three-stage amplification, a single transistor element according to the invention affords obtaining a current amplification of 1:10,000 or, as the case may be, results in an extremely sensitive photoelectric relay of multiplier action. Such a plural-stage element is fundamentally applicable in the same manner as a single transistor to form a component in any desired amplifier combination. This offers a number of advantages, such as a considerable reduction in space requirements, mounting requirements, as well as a simplification of the circuit connections and design of the more comprehensive devices in which the unit is to be used.

The invention will be further described with reference to the embodiments illustrated by way of example on the accompanying drawing, in which FIG. 1 shows, on enlarged scale, a cross section of a three-stage transistor according to the invention, with a schematic and explanatory indication of the various conductance regions in the appertaining semiconductor body.

The same reference numerals are used in the various illustrations for functionally similar items, respectively.

Figure 1:
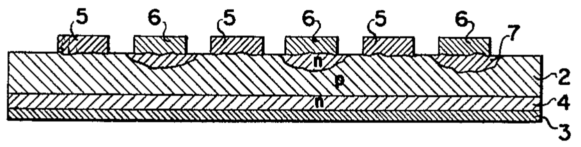
Figure 2:
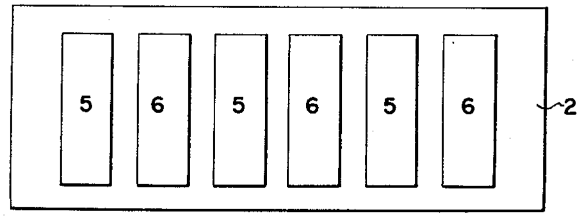
FIG. 2 is a top view of the same transistor.

The semiconductor body 2 in the illustrated embodiments may consist of a silicon plate or disc of which one side is covered by a foil 3 of a gold-antimony alloy containing, for example, approximately 1% antimony. The foil forms an alloyed diffusion bond with the semiconductor body 2 and serves as a common collector electrode for all transistors of the device. The stratum 4 of the semiconductor body adjacent to the collector electrode 3 is diffusion-doped by antimony and thus has n-type conductance. Mounted on the opposite flat side of the semiconductor body 2 are base electrode strips 5 and emitter strips 6 which extend side by side in spaced relation to each other in an alternating sequence. In the embodiment of FIGS. 1 and 2, the strip electrodes 5 and 6 are straight, whereas in the embodiment of FIG. 3 the strips form concentric circles about a centrally located, circular base electrode 5.

The base strip 5 may consist of aluminum and the emitter strips 6 of gold-antimony, whose antimony content may be about 1% as in the case of the collector-electrode foil. The base and emitter strip electrodes are alloyed together with the silicon body, thus forming a fusion bond. As a result each emitter strip 6 is located adjacent an antimony-doped local zone 7 of the semiconductor body 2, so that the emitter regions of the semiconductor are n-conducting. These n-type zones 7 penetrate slightly into the originally p-conducting silicon. The base regions of the respective base electrodes 5 are formed by partial regions of a coherent p-type stratum in which the silicon body 2 retains its p-type conductance.

Figure 4:
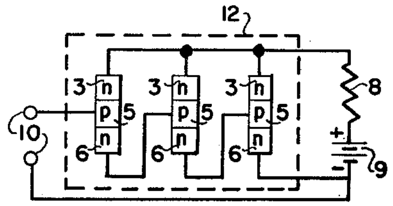
FIG. 4 is a schematic circuit diagram of a three-stage cascade in emitter connection, applying to transistors as shown in FIGS. 1 to 3.

The circuit diagram illustrated in FIG. 4 shows the internal wiring of the device in emitter connection. The emitter electrode 6 of each preceding transistor stage is connected with the base electrode 5 of the next following stage. The signal to be amplified is applied across terminals 10 connected to the base electrode 5 of the first stage and the emitter electrode of the last stage, respectively. The load circuit, connecting the collector means common to all transistors with the emitter electrode 6 of the output stage, is shown to comprise a load resistor 8 and a direct-current source 9. The casing of the device, constituted for example by a block of casting resin, is schematically indicated at 12 by a broken line. Only three terminal leads emerge from the casing or block 12 to the outside as is the case with an ordinary single-stage transistor. If desired, however, all electrode connections may extend out of the casing in order to permit using the same device selectively in cascade connection, in parallel connection, or in form of a combined cascade and parallel connection.

Figure 3:
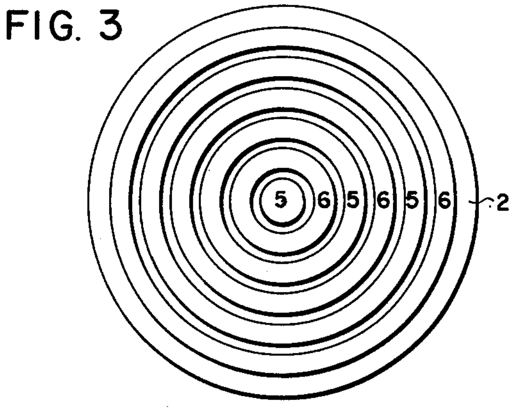
FIG. 3 illustrates a top view of a transistor in form of a circular disc, also designed for three-stage amplification.
Figure 6:
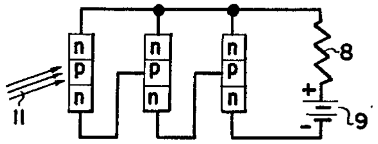
FIG. 6 illustrates a circuit diagram of the same phototransistor.
Figure 5:
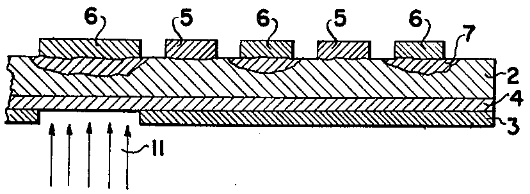
FIG. 5 shows in cross section a multiple-transistor device according to the invention designed as a phototransistor.

The phototransistor, according to FIGS. 5 and 6 may have a semiconductor body in form of a plate corresponding to FIGS. 1, 2 or in form of a circular disc as shown in FIG. 3. The design and circuit connection of the phototransistor are essentially as described above, except that the collector electrode 3 is interrupted or apertured in order to permit the ingress of light or other electromagnetic radiation schematically represented at 11. Subjected to the radiation is the first stage of the multiple-transistor device, whereas the others act as amplifying stages.

With respect to suitable dimensions or manufacture, reference may be had to the copending application of Adolf Herlet, Serial No. 776,323, filed November 25, 1958, for Power Transistors, now Patent No. 2,924,760 and assigned to the assignee of the present invention. It will be recognized however, that the particular substances used and described above or in said copending application are not essential to the invention proper, and that with respect to the shape and number of its components, a device according to my invention may be modified in various respects and hence may be embodied in structure and circuitry other than particularly illustrated and described herein, without departing from the essence of the invention and within the scope of the claims annexed hereto.

I claim:

1. A transistor device, comprising a plurality of individually operable triode junction transistors having a single semiconductor body and collector electrode means in common, said collector electrode means being joined with said body, said body having a coherent stratum of a given conductance type, each of said triode transistors having a single base electrode and an emitter electrode joined with said body in spaced relation to each other, the base electrodes and emitter electrodes of all individual transistors extending beside each other on said body in alternating sequence, said base electrodes being all joined with said coherent stratum of said given conductance type, and said body having a plurality of zones of the opposite conductance type adjacent to said respective emitter electrodes.

2. A transmitter device, comprising a plurality of individually operable junction transistors having a single semiconductor body and a single collector electrode in common, said body having flat shape and having two individually coherent main strata of different conductance types respectively, said collector electrode being joined on one flat side of said body with one of said strata, each of said transistors having a base electrode and an emitter electrode spaced from each other on the other flat side of said body, the base electrodes and emitter electrodes of all said transistors extending side by side in alternating sequence, said base electrodes being joined with said other coherent stratum, and said body having locally limited zones adjacent to said respective emitter electrodes, said zones having the same conductance type as said one stratum joined to said collector electrode, conductor means connecting the emitter electrode of each preceding one of said transistors with the base electrode of the next one of said transistors to form a cascade amplifier.

3. A transistor device, comprising a plurality of individually operable junction transistors having a single semiconductor body and a single collector electrode in common, said body having flat shape and having two individually coherent main strata of different conductance types respectively, said collector electrode being joined on one flat side of said body with one of said strata, each of said transistors having a base electrode and an emitter electrode spaced from each other on the other flat side of said body, the base electrodes and emitter electrodes of all said transistors extending side by side in alternating sequence, said base electrodes being joined with said other coherent stratum, said body having locally limited zones adjacent to said respective emitter electrodes, said zones having the same conductance type as said one stratum joined to said collector electrode, conductor means connecting the emitter electrode of each preceding one of said transistors with the base electrode of the next one of said transistors to form a cascade amplifier, the one transistor that forms the input stage of said amplifier consisting of a phototransistor.

4. A transistor device comprising a silicon semiconductor body having a coherent stratum of a given conductance type, collector electrode means joined with said body, a plurality of emitter electrodes and corresponding base electrodes joined with said body and extending beside each other in alternating sequence, each emitter electrode being positioned in spaced relation to one corresponding base electrode and forming with the one base electrode and said common collector means an individually operable junction transistor, said base electrodes being all joined with said coherent stratum of said given conductance type, and said body having a plurality of zones of the opposite conductance type adjacent to said emitter electrodes.

References Cited in the file of this patent

UNITED STATES PATENTS

| | | |
|---|---|---|
| 2,660,624 | Bergson | Nov. 24, 1953 |
| 2,663,806 | Darlington | Dec. 22, 1953 |
| 2,663,830 | Oliver | Dec. 22, 1953 |
| 2,668,184 | Taylor et al. | Feb. 2, 1954 |
| 2,779,877 | Lehovec | Jan. 29, 1957 |
| 2,886,739 | Matthews et al. | May 12, 1959 |
| 2,892,094 | Lehovec | June 23, 1959 |
| 2,897,295 | Zelinka | July 28, 1959 |
| 2,924,760 | Herlet | Feb. 9, 1960 |

OTHER REFERENCES

Bevitt: Transistors Handbook; Prentice-Hall, Inc.; 1956; pp. 149–175. (Copy in Div. 54.)